United States Patent
Schier et al.

(10) Patent No.: US 8,603,617 B2
(45) Date of Patent: Dec. 10, 2013

(54) TOOL HAVING A METAL OXIDE COATING

(75) Inventors: Veit Schier, Leinfelden-Echterdingen (DE); Wolfgang Engelhart, Metzingen (DE)

(73) Assignee: Walter AG, Tubingen (DE)

( * ) Notice: Subject to any disclaimer, the term of this patent is extended or adjusted under 35 U.S.C. 154(b) by 363 days.

(21) Appl. No.: 12/994,952

(22) PCT Filed: May 5, 2009

(86) PCT No.: PCT/EP2009/055403
§ 371 (c)(1),
(2), (4) Date: Feb. 22, 2011

(87) PCT Pub. No.: WO2009/144119
PCT Pub. Date: Dec. 3, 2009

(65) Prior Publication Data
US 2011/0182681 A1    Jul. 28, 2011

(30) Foreign Application Priority Data
May 31, 2008  (DE) .......................... 10 2008 026 358

(51) Int. Cl.
*B32B 9/00* (2006.01)
(52) U.S. Cl.
USPC ............... 428/216; 51/307; 51/309; 428/336; 428/697; 428/698; 428/699; 428/701; 428/702
(58) Field of Classification Search
USPC ............ 51/307, 309; 428/216, 336, 697, 698, 428/699, 701, 702
See application file for complete search history.

(56) References Cited

U.S. PATENT DOCUMENTS

| | | | | |
|---|---|---|---|---|
| 5,310,607 A | * | 5/1994 | Schulz et al. | 428/697 |
| 6,767,627 B2 | * | 7/2004 | Morikawa et al. | 428/336 |
| 7,955,722 B2 | * | 6/2011 | Tamagaki et al. | 428/701 |
| 2006/0263640 A1 | | 11/2006 | Tamagaki et al. | |

FOREIGN PATENT DOCUMENTS

| | | |
|---|---|---|
| WO | 2006/099754 | 9/2006 |
| WO | 2008/043606 | 4/2008 |

OTHER PUBLICATIONS

Search Report dated Jul. 27, 2009 for International Application No. PCT/EP2009/055403 filed May 5, 2009.
Written Opinion dated Jul. 27, 2009 for International Application No. PCT/EP2009/055403 filed May 5, 2009.
Ramm, Jürgen et al., "Pulse enhanced electron emission (P3e™) arc evaporation and the synthesis of wear resistant Al—CR—O coatings in corundum structure", Surface & Coatings Technology 202 (2007), pp. 876-883.
Trinh, D.H. et al., "Radio frequency dual magnetron sputtering deposition and characterization or nanocomposite $Al_2O_{3-ZrO_2}$ thin films", J. Vac. Sci. Technol. A 24(2), Mar./Apr. 2006, American Vacuum Society 2006, pp. 309-316.
Teixeira, V. et al., "Deposition of composite and nanolaminate ceramic coatings by sputtering", Vacuum 67 (2002), pp. 477-482.

* cited by examiner

*Primary Examiner* — Archene Turner
(74) *Attorney, Agent, or Firm* — Morgan, Lewis & Bockius LLP

(57) ABSTRACT

The invention concerns a cutting tool comprising a base body and a multi-layer coating applied thereto, which, possibly besides further layers, includes a plurality of main layers A and intermediate layers B applied alternately directly one upon the other, wherein the main layers A and the intermediate layers B are respectively metal oxide layers produced by the PVD process, the thickness of the main layers A is in the range of 4 nm to 1 μm, and the thickness of the intermediate layers B is in the range of 2 nm to 50 nm, wherein the ratio of the thicknesses of the intermediate layers B to the thicknesses of the main layers A is in the range of 1:2 to 1:100.

28 Claims, No Drawings

TOOL HAVING A METAL OXIDE COATING

This application is the National Stage of International Application No. PCT/EP2009/055403, filed May 5, 2009, and claims benefit of Germany Application No. 10 2008 026 358.3, filed May 31, 2008.

STATE OF THE ART

Cutting tools comprise a base body which is produced for example from carbide metal, cermet, steel or high-speed steel. To increase the service lives or also to improve the cutting properties, a single-layer or multi-layer coating is frequently applied to the base body. That coating includes for example metallic hard material layers, oxide layers and the like. CVD processes (chemical gaseous phase deposition or chemical vapour deposition) and/or PVD processes (physical gaseous phase deposition or physical vapour deposition) are used for applying the coating. A plurality of layers within a coating can be applied exclusively by means of CVD processes, exclusively by means of PVD processes or by a combination of those processes.

In relation to the PVD processes a distinction is made between various variants of the processes such as magnetron sputtering, arc vapour deposition (arc-PVD), ion plating, electron beam deposition and laser ablation. Magnetron sputtering and arc vapour deposition are included among the PVD processes most frequently used for coating tools. Within individual PVD process variants there are in turn different modifications such as for example unpulsed or pulsed magnetron sputtering or unpulsed or pulsed arc vapour deposition and so forth.

The target in the PVD process can comprise pure metal or a combination of two or more metals. If the target includes a plurality of metals all those metals are incorporated at the same time into the layer of a coating, which is built up in the PVD process.

The quantitative ratio of the metals relative to each other in the layer that is built up will depend on the quantitative ratio of the metals in the target, but also the conditions in the PVD process as individual metals are dissolved out of the target in larger amounts and/or are deposited on the substrate in larger amounts, than other metals.

To produce given metal compounds, reactive gases are fed to the reaction chamber of the PVD process such as for example nitrogen to produce nitrides, oxygen to produce oxides, carbonaceous compounds for producing carbides, carbonitrides, oxycarbides and so forth or mixtures of those gases to produce corresponding mixed compounds.

In the PVD process a so-called bias potential is generally applied to the substrate to be coated in order to achieve the surface energy necessary for the growth process and thus atomic mobility. The energy is necessary to achieve crystalline structures in relation to a layer which is growing. When applying insulation layers using the PVD process, which applies for example to a large number of metal oxide compounds, the effectively applied bias potential is reduced during the growth process with increasing layer thickness by virtue of the insulating properties of the layer material, which worsens the growth conditions at the layer surface and in addition finally results in exclusively or primarily amorphous structures being grown. When depositing insulating layer materials when using DC bias potential (DC bias) or pulsed DC bias potential those amorphous structures are inevitable but are not wanted because they have worse material properties than crystalline layers such as inter alia worse high-temperature resistance, worse thermodynamic stability, lower hardness and so forth.

Ramm, J. et al., Pulse enhanced electron emission (P3e™) arc evaporation and the synthesis of wear resistant Al—Cr—O coatings in corundum structure, Surface & Coatings Technology 202 (2007), pages 876-883, describe the deposition of aluminium oxide-chromium oxide layers by pulsed arc vapour deposition (arc-PVD). The deposited layers firstly exhibit a mixed crystal structure which becomes amorphous with increasing layer thickness towards the surface.

Teixeira, V. et al., Deposition of composite and nanolaminate ceramic coatings by sputtering, Vacuum 67 (2002), pages 477-483, describe the deposition of thin zirconium oxide/aluminium oxide layers in the nanometer range by magnetron sputtering. The layers exhibit crystalline portions of zirconium oxide but only amorphous portions of aluminium oxide.

Trinh, D. H. et al., Radio frequency dual magnetron sputtering deposition and characterization of nanocomposite $Al_2O_3$—$ZrO_2$ thin films, J. Vac. Sc. Techn. A 24(2), March/April 2006, pages 309-316 describe the deposition of very thin zirconium oxide/aluminium oxide layers in the nanometer range by magnetron sputtering which present crystalline portions of zirconium oxide but no crystalline portions of aluminium oxide.

OBJECT

The object of the present invention was that of providing cutting tools which are improved over the state of the art, in particular with a multi-layer coating with metal oxide layers with a very high crystalline proportion.

The object according to the invention is attained by a cutting tool comprising a base body and a multi-layer coating applied thereto, which, possibly besides further layers, includes a plurality of main layers A and intermediate layers B applied alternately directly one upon the other, wherein the main layers A and the intermediate layers B are respectively metal oxide layers produced by the PVD process, the thickness of the main layers A is in the range of 4 nm to 1 μm, and the thickness of the intermediate layers B is in the range of 2 nm to 50 nm, wherein the ratio of the thicknesses of the intermediate layers B to the thicknesses of the main layers A is in the range of 1:2 to 1:100.

As has already been set forth in the opening. part of this specification, in the deposition of many metal oxides using the PVD process, by virtue of their insulating properties, there is the problem that the applied bias potential decreases with increasing layer thickness so that at the same time the crystallinity of the deposited layer becomes less and the amorphous proportion increases. That worsens a multiplicity of the material properties desired for such a coating. In accordance with the invention that problem is overcome in that in the deposition of a main material of metal oxide which here forms the main layers A, thin intermediate layers B of an intermediate layer material are inserted. By virtue of its insulating properties, in the deposition operation using the PVD process, the main layer material A would lose more and more crystallinity with increasing layer thickness, and increasingly give an amorphous structure. The intermediate layer material B is so selected that, under the deposition conditions, it grows in crystalline form on the main layer A and thus promotes the renewed crystalline growth of the main layer material A.

The thickness of the main layers A is in the range of 4 nm to 1 μm, and the thickness of the intermediate layers B is in the range of 2 nm to 50 nm. The ratio of the thicknesses of the intermediate layers B to the thicknesses of the main layers A is in the range of 1:2 to 1:100. The intermediate layers B are therefore very thin in relation to the main layers A. There is no need for the thicknesses of the individual layers, that is to say the thicknesses of the main layers A relative to each other and the thicknesses of the intermediate layers B relative to each other, to be kept constant over the entire layer. The main layers A which are separated from each other by intermediate layers B can be of different layer thicknesses, as also the individual intermediate layers B can be of different thicknesses. It will be appreciated that alternatively the main layers A may also be of the same thicknesses throughout and/or the intermediate layers B may be of the same thicknesses throughout. For example 15 nm thick main layers A of aluminium/chromium oxide may alternate with 3 nm thick intermediate layers B of zirconium oxide and may be deposited uniformly in crystalline form up to a total layer thickness of more than 5 μm.

In an embodiment of the invention the main layers A comprise an oxide or oxides of a metal or at least two different metals selected from the metals of the main groups 2 and 3 and subgroups 1 to 8 of the periodic system of elements, preferably selected from Al and Cr and particularly preferably from Cr oxide, Al oxide or AlCr mixed oxide, such as for example $(Al,Cr)_2O_3$.

In a further embodiment of the invention the intermediate layers B comprise an oxide or oxides of a metal or at least two different metals, selected from Sc, Y, Ti, Zr, Hf, V, Nb, Ta, preferably selected from Zr and Y, and particularly preferably from Zr oxide, Y oxide or ZrY mixed oxide. Intermediate layers B of Zr oxide are quite particularly preferred as they still involve crystalline growth even with a low bias.

Complete crystallinity of the main layers A cannot always guaranteed. Even with thin main layers A prior to the deposition of a new intermediate layer B, within the main layers there can involve a decrease in the crystalline and an increase in the amorphous proportion of the deposited compound or compounds. The invention also covers such cutting tools, but only insofar as the predominant proportion of the main layers A is crystalline. Preferably more than 80% by volume of the main layers A is crystalline, particularly preferably more than 90% by volume of the main layers A is crystalline and quite particularly preferably more than 95% by volume of the main layers A is crystalline.

Upon a reduction in the crystalline and an increase in the amorphous proportion of the deposited metal oxide compound or compounds there is thus a gradient involving decreasing crystallinity. Preferably in that respect, at the commencement of deposition of a main layer A, that is to say for example directly subsequently to an intermediate layer B, the deposited metal oxide should be present almost completely in crystalline form. With increasing layer thickness of a main layer A the crystallinity can decrease in the course of the deposition operation, but the decrease in crystallinity should not fall below 80% by volume, preferably not below 85% by volume of crystalline metal oxide. If the crystallinity should fall more greatly the layer thickness would have to be kept smaller and an intermediate layer B would have to be deposited earlier.

In a preferred embodiment therefore the invention covers a cutting tool of the aforementioned kind, wherein within a main layer A the proportion of metal oxide in crystalline form decreases over the total thickness of the respective main layer A in the direction from the substrate outwardly from a proportion in the range of 100 to 90% by volume of crystalline metal oxide, preferably 100 to 95% by volume of crystalline metal oxide, to a proportion of at least 80% by volume of crystalline metal oxide, preferably at least 85% by volume of crystalline metal oxide.

The proportion by volume of crystalline metal oxide in the deposited layers is determined by means of X-ray measurements, in the present case by grazing incidence X-ray diffraction (GIXRD). That standard method gives semi-quantitative information about the crystallinity in the sample, which correlates with the intensity of the X-ray peaks. In addition, in accordance with that method, depth-dependent X-ray structure resolution can be implemented in certain measurement arrangements and by a variation in the radiation angles.

In a further preferred embodiment of the invention the thickness of the main layers A is in the range of 5 nm to 50 nm, preferably in the range of 10 nm to 30 nm, and/or the thickness of the intermediate layers B is in the range of 3 nm to 15 nm, preferably in the range of 3 nm to 8 nm.

The problem of the metal oxide material of the main layers A, that is to be overcome by the invention, is that the material loses crystallinity in the PVD deposition operation with increasing layer thickness and acquires higher amorphous proportions. When the amorphous proportion rises and to what extent in the deposition of a coating depends on various parameters such as for example the deposited layer material itself and the various conditions in the PVD deposition process. It is therefore not possible from the outset to establish for each material and for each deposition process, the layer thickness as from which an intermediate layer B is again to be applied over a deposited main layer A in order to stop or prevent the formation of amorphous structures and to further promote crystalline growth. Not least the choice of the thickness of the main layers A also depends on the extent to which the deviation from a purely crystalline growth in respect of the main layers A is to be allowed. In the case of a main layer material in which the change to amorphous structures already initiates at a low deposition thickness, the application of an intermediate layer B will already be required when the main layer A is of a smaller thickness than in the case of a material which grows in the crystalline form up to a greater layer thickness. The ideal conditions and layer thicknesses required for that purpose can however be ascertained by the man skilled in the art for given combinations of materials and PVD processes by simple experiments. As a rule of thumb the main layer material acquires higher crystallinity over the entire layer if the individual main layers A are of a smaller layer thickness before an intermediate layer B follows and thus promotes the renewed crystalline growth of the main layer material A thereon. The thickness of the main layers A however should also not be selected to be too small so that the proportion of the intermediate layer material B which in fact is intended substantially to serve to acquire the crystalline structure upon growth of the main layer material A should not be too high and not become a determining constituent of the overall layer.

Preferably the ratio of the thicknesses of the intermediate layers B to the thicknesses of the main layers A is in the range of 1:3 to 1:20, preferably in the range of 1:4 to 1:8.

In a preferred embodiment of the invention the main layers A predominantly comprise mixed-crystalline $(Al,Cr)_2O_3$ with a corundum structure and/or the intermediate layers B predominantly comprise crystalline $ZrO_2$. Many other metal oxides or metal oxide combinations as coatings have proven to be too soft for metal cutting machining.

All known PVD processes are suitable for deposition of the layers of the cutting tool according to the invention. Preferably the PVD processes for production of the main layers A and the intermediate layers B are selected from magnetron sputtering, arc vapour deposition (arc-PVD), ion plating, electron beam evaporation and laser ablation.

In an embodiment the cutting tool of the present invention has a coating which only consists of the main layers A and intermediate layers B applied alternately to the base body in directly mutually superposed relationship. Alternatively the coating also includes further layers over and/or under the multiplicity of main layers A and intermediate layers B which are alternately applied directly in mutually superposed relationship, wherein those additional layers in the coating are selected from carbides, nitrides, oxides, carbonitrides, oxynitrides, oxycarbides, oxycarbonitrides, borides, boron nitrides, boron carbides, boron carbonitrides, boron oxynitrides, boron oxocarbides, boron oxocarbonitrides, oxoboron nitrides of the elements of groups IVa to VIIa of the periodic system and/or aluminium and/or silicon including mixed-metallic phases as well as phase mixtures of the aforementioned compounds. Examples of suitable additional layers in the coating according to the invention are TiAlN layers, TiN layers or TiC layers.

In a further embodiment of the invention the layer comprising the multiplicity of main layers A and intermediate layers B alternately applied directly in mutually superposed relationship are of a total thickness of 1 µm to 20 µm, preferably 2 µm to 15 µm, particularly preferably 3 µm to 10 µm, quite particularly preferably 4 µm to 7 µm. With excessively great layer thicknesses there is the risk of spalling because of excessively high mechanical stresses in the layer.

In a further embodiment of the invention the coating has a Vickers hardness (Hv) of 1000 to 4000, preferably more than 1500, particularly preferably more than 2000.

The base body of the cutting tool according to the invention is desirably made from carbide metal, cermet, steel or high-speed steel (HSS).

In a further embodiment of the invention the metal oxides of the main layers A and intermediate layers B which are alternately applied in directly mutually superposed relationship have the same crystal structure.

The novel coating of the present invention opens a wide range of possible options for improving and/or adapting resistance to wear, service lives and/or cutting properties of cutting tools as according to the invention metal oxide layers of a crystal structure can be deposited, which hitherto for the above-mentioned reasons had a high amorphous structural component and therefore different material properties from the coating of the present invention.

The resistance to wear, durability and cutting properties of a coating on a cutting tool depend on various factors such as for example the material of the base body of the cutting tool, the sequence, nature and composition of the layers present in the coating, the thickness of the various layers and not least the nature of the cutting operation performed with the cutting tool. Different degrees of resistance to wear can be afforded for one and the same cutting tool in dependence on the nature of the workpiece to be machined, the respective machining process and the further conditions during the machining operation such as for example the generation of high temperatures or the use of corrosive cooling fluids. In addition a distinction is drawn between various kinds of wear which depending on the respective machining operation can influence the period of use of a tool, that is to say its service life, to a greater or lesser degree. The development of and improvement in cutting tools is therefore always to be considered in relation to which tool properties are to be improved and under comparable conditions are to be judged in relation to the state of the art.

An essential property of cutting tools which is improved by the coating according to the invention over the state of the art with coatings of the same materials is the hardness of such a coating. The markedly greater hardness of the coating according to the invention is to be attributed to the high proportion of crystallinity achieved with the coating according to the invention. Metal oxide coatings applied by means of PVD processes, in accordance with the state of the art, involving comparable layer thicknesses, generally have a markedly higher amorphous proportion in the structure, and that detrimentally influences the material properties, inter alia hardness.

A further surprising effect which was observed with coatings according to the invention is a reduction in the thermal conductivity of the overall coating. That surprisingly achieved reduction in thermal conductivity of the coating has a highly positive effect in use of such cutting tools when cutting machining metals and composite materials. The reduced thermal conductivity leads to improved thermal shock resistance and thus increased resistance to comb-type cracks.

The reason for the reduced thermal conductivity in relation to coatings in the state of the art, with the coatings according to the invention, is not accurately clarified. It is assumed that the reduced thermal conductivity could be attributed to the intermediate layers B integrated into the coating. Further tests with different coating materials which are in progress at the present time should give more precise information about the mechanisms leading to the reduced thermal conductivity.

It is self-evident that all individual features as are described herein for certain embodiments according to the invention, insofar as this is technically viable and possible, can be combined with all other described features of embodiments according to the invention and such combinations are deemed to be disclosed in the context of this description. Individual identification of all possible combinations is dispensed with herein only for reasons of better readability.

Further advantages, features and embodiments of the present invention are described by means of the examples hereinafter.

EXAMPLES

Carbide metal substrates of the composition were provided with a multi-layer PVD coating in a PVD coating installation (Flexicoat; Hauzer Techno Coating). The substrate geometry was SEHW120408 and ADMT160608-F56 (in accordance with DIN-ISO 1832). Prior to deposition of the layers the installation was evacuated to $1 \times 10^{-5}$ mbar and the carbide metal surface cleaned by ion etching with 170 V bias voltage.

Example 1

Main layers A: $(Al,Cr)_2O_3$
PVD process: arc vapour deposition (arc-PVD)
target: Al/Cr (70/30 At. %), round source (63 mm diameter)
deposition: temperature: 600° C.; vaporiser current: 80 amperes;
1 Pa $O_2$ pressure,
100 volts substrate bias voltage, DC pulsed at 70 kHz
Intermediate layers B: $ZrO_2$
PVD process: arc vapour deposition (arc-PVD)
target: Zr round source (63 mm diameter)

deposition: temperature: 600° C.; vaporiser current: 80 amperes;
1 Pa O$_2$ pressure,
100 volts substrate bias voltage, DC pulsed at 70 kHz
layer thicknesses: main layers A: 150 nm (Al,Cr)$_2$O$_3$
intermediate layers B: 10 nm ZrO$_2$
Overall layer of main layers A and intermediate layers B: ca. 5 μm Comparative Example 1

Like Example 1 but without deposition of intermediate layers B.

In accordance with example 1 according to the invention main layers A were alternately deposited in a thickness of 150 nm and therebetween intermediate layers B in a thickness of 10 nm to give an overall layer thickness of about 5 μm on the substrate body. Investigations showed that the total coating in all layers was of a uniformly high crystallinity above 95% by volume over the complete layer thickness.

In a comparative test (comparative example 1) only main layer material A (Al,Cr)$_2$O$_3$ without intermediate layers was deposited using the same process as in example 1. The coating firstly grows in crystalline form in a mixed crystal involving a corundum structure. As from a layer thickness of about 2 μm the layer becomes increasingly amorphous and after about 4 μm is X-ray amorphous and further remains structureless.

The measured Vickers hardness of the crystalline layer applied in accordance with the invention in example 1 was about 2000 Hv, whereas the layer applied in comparative example 1 with a high amorphous component was only of a hardness of about 1000 Hv.

In addition the layer applied in accordance with the invention in example 1 exhibited a markedly lower thermal conductivity than the layer without intermediate layers B, deposited in accordance with comparative example 1.

In a milling test on a workpiece comprising 42CrMoV4 steel (strength: 850 MPa) the cutting tools of example 1 and comparative example 1 were compared. For those tests the substrates were firstly provided with a 3 μm thick coating of TiAlN before the oxidic main and intermediate layer materials were applied. Milling was effected in downcut mode without cooling lubricant at a cutting speed V$_c$=236 m/min and with a tooth advance f$_z$=0.2 mm.

The wear was measured on the clearance surface as a mean wear mark width VB in mm (at the main cutting edge) after a milling travel of 4800 mm. The following wear mark widths VB were found:
Wear mark width VB
Example 1: 0.12 mm
Comparative example 1: 0.20 mm

The invention claimed is:

1. A cutting tool comprising a base body and a multi-layer coating applied thereto,
which, possibly besides further layers, includes a plurality of main layers A and intermediate layers B applied alternately directly one upon the other,
wherein the main layers A and the intermediate layers B are respectively metal oxide layers produced by the PVD process,
the thickness of the main layers A is in the range of 4 nm to 1 μm, and
the thickness of the intermediate layers B is in the range of 2 nm to 50 nm,
wherein the ratio of the thicknesses of the intermediate layers B to the thickness of the main layers A is in the range of 1:2 to 1:100 and wherein within a main layer A the proportion of metal oxide in crystalline form decreases over the total thickness of the respective main layer A in the direction from the substrate outwardly from a proportion in the range of 100 to 90% by volume of crystalline metal oxide to a proportion of at least 80% by volume of crystalline metal oxide.

2. A cutting tool according to claim 1 wherein the main layers A comprise an oxide or oxides of a metal or at least two different metals selected from the metals of the main groups 2 and 3 and subgroups 1 to 8 of the periodic system of elements.

3. A cutting tool according to claim 2 wherein the metal or the at least two different metals are selected from the group consisting of Al and Cr.

4. A cutting tool according to claim 2 wherein the metal or the at least two different metals are Cr oxide, Al oxide or AlCr mixed oxide.

5. A cutting tool according to claim 4 wherein the metal or the at least two different metals is (Al,Cr)$_2$O$_3$.

6. A cutting tool according to claim 1 wherein the intermediate layers B comprise an oxide or oxides of a metal or at least two different metals, selected from the group consisting of Sc, Y, Ti, Zr, Hf, V, Nb and Ta.

7. A cutting tool according to claim 6 wherein the metal or the at least two different metals are selected from the group consisting of Zr and Y.

8. A cutting tool according to claim 6 wherein the metal oxides or the at least two different metal oxides are selected from the group consisting of Zr oxide, Y oxide and ZrY mixed oxide.

9. A cutting tool according to claim 1 wherein the predominant proportion of the main layers A is crystalline.

10. A cutting tool according to claim 9 wherein more than 80% by volume of the main layers A is crystalline.

11. A cutting tool according to claim 10 wherein more than 90% by volume of the main layers A is crystalline.

12. A cutting tool according to claim 11 wherein more than 95% by volume of the main layers A is crystalline.

13. A cutting tool according to claim 1 wherein the thickness of the main layers A is in the range of 5 nm to 50 nm and/or the thickness of the intermediate layers B is in the range of 3 nm to 15 nm.

14. A cutting tool according to claim 13 wherein the thickness of the main layers A is in the range of 10 nm to 30 nm, and/or the thickness of the intermediate layers B is in the range of 3 nm to 8 nm.

15. A cutting tool according to claim 1 wherein the ratio of the thicknesses of the intermediate layers B to the thicknesses of the main layers A is in the range of 1:3 to 1:20.

16. A cutting tool according to claim 15 wherein the ratio of the thicknesses of the intermediate layers B to the thicknesses of the main layers A is in the range of 1:4 to 1:8.

17. A cutting tool according to claim 1 wherein the main layers A predominantly comprise mixed-crystalline (Al,Cr)$_2$O$_3$ with a corundum structure and/or the intermediate layers B predominantly comprise crystalline ZrO$_2$.

18. A cutting tool according to claim 1 wherein the PVD processes for the production of the main layers A and the intermediate layers B are selected from the group consisting of i) rMS, ii) arc vapour deposition (arc-PVD), iii) ion plating, iv) electron beam vapour deposition, and v) laser ablation.

19. A cutting tool according to claim 1 wherein besides the multiplicity of main layers A and intermediate layers B which are alternately applied in directly mutually superposed relationship the coating includes further layers selected from the group consisting of carbides, nitrides, oxides, carbonitrides, oxynitrides, oxycarbides, oxycarbonitrides, borides, boron nitrides, boron carbides, boron carbonitrides, boron oxynitrides, boron oxocarbides, boron oxocarbonitrides, oxoboron nitrides of the elements of groups IVa to VIa of the periodic system and/or aluminium and/or silicon including mixed-metallic phases as well as phase mixtures of the aforementioned compounds.

20. A cutting tool according to claim 1 wherein in the coating the multiplicity of main layers A and intermediate layers B which are alternately applied in directly mutually superposed relationship are of a total thickness of 1 μm to 20 μm.

21. A cutting tool according to claim 20 wherein the total thickness is 2 μm to 15 μm.

22. A cutting tool according to claim 21 wherein the total thickness is 3 μm to 10 μm.

23. A cutting tool according to claim 22 wherein the total thickness is 4 μm to 7 μm.

24. A cutting tool according to claim 1 wherein the coating has a Vickers hardness (Hv) of 1000 to 4000.

25. A cutting tool according to claim 24 wherein the Vickers hardness (Hv) of the coating is more than 1500.

26. A cutting tool according to claim 25 wherein the Vickers hardness (Hv) of the coating is more than 2000.

27. A cutting tool according to claim 1 wherein the base body comprises carbide metal, cermet, steel or high-speed steel (HSS).

28. A cutting tool according to claim 1 wherein the metal oxides of the main layers A and intermediate layers B which are alternately applied in directly mutually superposed relationship have the same crystal structure.

* * * * *